(12) United States Patent  (10) Patent No.: US 6,312,964 B1
Moyal  (45) Date of Patent: Nov. 6, 2001

(54) CIRCUIT, STRUCTURE AND METHOD OF TESTING A SEMICONDUCTOR, SUCH AS AN INTEGRATED CIRCUIT

(75) Inventor: Nathan Y. Moyal, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/648,221

(22) Filed: Aug. 25, 2000

Related U.S. Application Data

(62) Division of application No. 08/865,667, filed on May 30, 1997, now Pat. No. 6,111,269.

(51) Int. Cl.[7] .............................. G01R 31/26; H01L 21/66
(52) U.S. Cl. .............................. 438/18; 438/11; 324/765
(58) Field of Search .................................. 438/11, 14, 17, 438/18, FOR 142; 257/48; 29/25.01; 324/523, 500, 555, 765

(56) References Cited

U.S. PATENT DOCUMENTS

| | | | |
|---|---|---|---|
| 3,983,479 | 9/1976 | Lee et al. .......................... | 324/158 R |
| 4,447,894 | * 5/1984 | Imamura . | |
| 4,575,714 | 3/1986 | Rummel ............................. | 340/568 |
| 4,855,253 | 8/1989 | Weber ................................ | 437/8 |
| 4,970,454 | * 11/1990 | Stambaugh et al. . | |
| 4,970,724 | * 11/1990 | Yung . | |
| 4,980,639 | * 12/1990 | Yoshizawa . | |
| 5,051,690 | 9/1991 | Maly et al. ....................... | 324/158 R |
| 5,485,095 | 1/1996 | Bertsch et al. .................... | 324/537 |
| 5,514,974 | 5/1996 | Bouldin ............................. | 324/763 |
| 5,523,252 | * 6/1996 | Saito . | |
| 5,627,083 | 5/1997 | Tounai ............................... | 438/18 |
| 5,633,173 | 5/1997 | Bae .................................... | 438/16 |
| 5,640,137 | 6/1997 | Mantha ............................. | 338/308 |
| 5,641,699 | 6/1997 | Hirase et al. ..................... | 438/130 |
| 5,821,765 | 10/1998 | Ling et al. ........................ | 324/765 |
| 5,857,258 | * 1/1999 | Penzes et al. . | |
| 5,900,735 | 5/1999 | Yamamoto ....................... | 324/537 |

FOREIGN PATENT DOCUMENTS

112998-A * 7/1984 (EP) .
2000131376 * 5/2000 (JP) .

OTHER PUBLICATIONS

Measuring Dimensions Using Murray Daggers, By: Kevin Murray, Dec. 1982, pp. 69–74.

* cited by examiner

Primary Examiner—George Fourson
Assistant Examiner—Thanh V Pham
(74) Attorney, Agent, or Firm—Christopher P. Maiorana, P.C.

(57) ABSTRACT

A method of testing an integrated circuit having a layout structure which includes a plurality of branch structures, the method comprising the steps of: (A) generating a control current in response to an input reference; (B) establishing a respective branch current through each of the plurality of branch structures when a process bias supports fabrication of a respective predetermined dimension associated with the branch structures; and (C) generating, in response to the branch currents, an output indicative of the process bias obtained during fabrication of the layout structure.

19 Claims, 6 Drawing Sheets

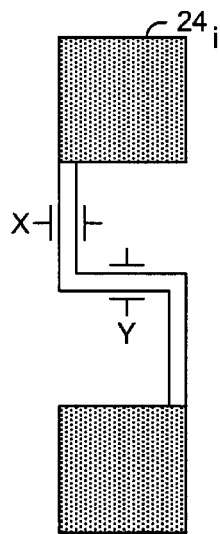
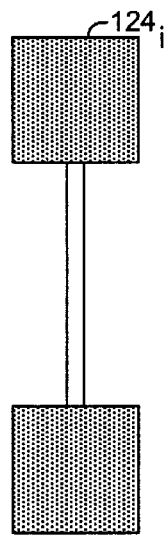
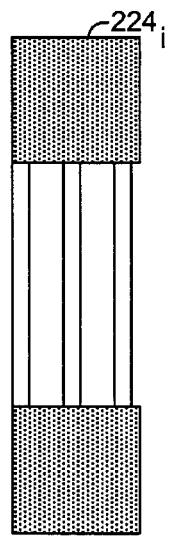
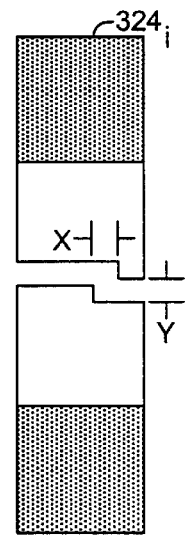
FIG. 3A  FIG. 3B  FIG. 3C  FIG. 3D
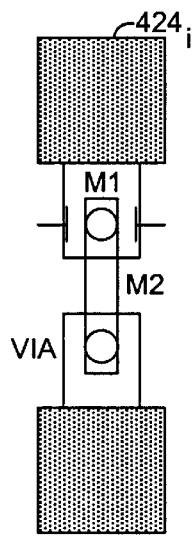
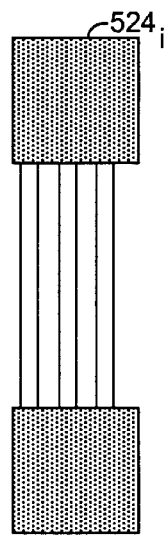
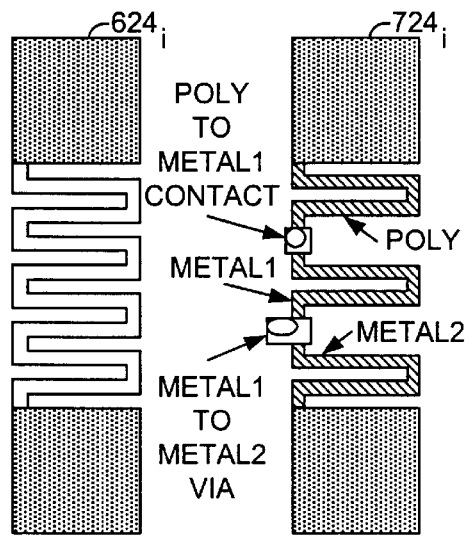
FIG. 3E  FIG. 3F  FIG. 3G  FIG. 3H

CIRCUIT, STRUCTURE AND METHOD OF TESTING A SEMICONDUCTOR, SUCH AS AN INTEGRATED CIRCUIT

This is, divisional of U.S. Ser. No. 08/865,667, filed May 30, 1997, now U.S. Pat. No. 6,111,269.

BACKGROUND OF THE INVENTION

1. Technical Field

The present invention relates generally to testing/ evaluation, and particularly, to a circuit, structure and method of testing a semiconductor, such as an integrated circuit.

2. Discussion of the Related Art

Fabrication of semiconductor structures, such as integrated circuits, involves many steps, and it is thus inevitable that variations will occur in one or more of the steps that will cause the final structure to diverge from an ideal design. Specifically, one or more steps may involve transferring patterns of geometric shapes on a mask to a resist covering the surface of the semiconductor wafer. The patterns, as is well known, may define areas of integrated circuit, such as, for example, a contact, a via, bonding pad area, a metal or poly connecting structure, etc. Of course, the resist patterns are not permanent, but are merely a means to replicate in an underlying layer the desired circuit feature. Conventionally, the pattern transfer is completed by an etching process.

Recognizing that variations occur during the fabrication process which inevitably limit the minimum feature dimension that can be formed on a semiconductor wafer, it is desirable to determine the extent to which the dimensions, as formed on the semiconductor wafer, deviate from an ideal dimension (i.e., so-called "process bias"). Further, as device geometries continue to shrink, it has become more difficult to measure to the absolute value of the minimum feature dimension (i.e., so called "process resolution"). This and related parameters are important since those dimensions affect yield and speed. As another example, an end-of-line determination of process bias may provide the basis for a go no-go ("scrap") decision concerning the part. That is, too much deviation may cause the part not to operate as desired. Process bias and process resolution arc related. Specifically, determining that a particular feature having a minimum dimension did not form on the semiconductor wafer means both that the process resolution is less than the feature dimension, and, that the process has deviated by at least the minimum feature dimension from the ideal ("process bias").

One approach taken in the art provides for a visual determination of process bias/resolution. Specifically, a mask used for patterning certain circuit features also includes a test pattern of progressively narrowing width rectangles stacked one above another and collectively positioned adjacent a reference structure (e.g., which may be a "stack" of a plurality of diamond-shaped features). Alternately, right triangles may be used in lieu of rectangles. After the test structure has been "printed" (i.e., photo/etch), a fabrication operator visually identifies the narrowest rectangle that was actually printed. The width of the largest width rectangle that was not formed is used to provide an indication of the process bias/resolution. One disadvantage of this approach is that it is somewhat subjective (i.e, one operator might read a 0.1 $\mu$m bias, while another might see 0.2 $\mu$m. That is, the certainty is less than is desirable. In addition, such approach does not provide the means to evaluate other geometrical features (such as corners), nor integrated structures, such as a combination of layers. The foregoing approach must thus be done for each layer of the semiconductor structure being evaluated.

Another approach in the art seeks to determine the amount of process bias through the generation of an electrical signal, and includes the formation of a test structure on the wafer. The test structure includes a wide electrically conductive rectangle adjoining a narrow electrically conductive rectangle. By impressing a voltage across the test structure, a current flows through both the wide and narrow rectangles. By equating the sheet resistance for each rectangle, a delta width ($\Delta W$) may be derived. The $\Delta W$ which provides an indication of the process bias. A disadvantage of this approach is that is requires several pads, including a power supply pad and ground pad. In addition, the electrical tests derives only single delta width; however, the wider conductive rectangle (commonly polycrystalline silicon) may have a different photo/etch bias relative to the narrow rectangle. Thus, the $\Delta W$ obtained is really a compromise value. Also, as was the case with the visual test structure, sharp corners or other geometrical features are not monitored for process bias.

There is thus a need to provide an improved test circuit/ structure and method that minimizes or eliminates one or more of the problems as set forth above.

SUMMARY OF THE INVENTION

According to one aspect of the present invention, a layout structure for testing an integrated circuit fabricated according to a process is provided. The layout structure includes a plurality of branch structures. A first branch structure has a first feature that is present (i.e., formed) when a process bias supports fabrication of a first predetermined dimension. The first feature is absent (not formed) otherwise. A second branch structure is spaced apart from and adjacent to the first branch structure and has a second feature that is present when the process bias supports fabrication of a second predetermined dimension. The second feature is absent otherwise. In addition, the second predetermined dimension is larger than the first predetermined dimension. The absence of at least one of the first or second features provides an indication of the magnitude of the process bias. The foregoing layout structure provides the means for visually determining the process bias/resolution.

In another aspect of the invention, a device for testing an integrated circuit fabricated according to a process is provided and which includes two major portions. The first major portion comprises a layout structure including a plurality of branch structures as described above. Each branch has a first end and a second end. The plurality of second ends are connected to a common node. The second major portion includes means coupled to the first ends and the common node for generating a process bias signal indicative of a process bias associated with the process. Through the foregoing, an electrical test is provided to determine the extent of the process bias.

In a preferred embodiment, each branch structure includes a respective feature having a predetermined dimension. The respective predetermined dimensions of the branch structures increase progressively. Each feature is present (formed), when a process bias supports fabrication of the respective predetermined dimension. Such feature, when present, is electrically conductive, thus forming an electrical connection between the respective first end and the common node. When the feature is absent the branch structure presents an electrical "Copcn" circuit between the respective first end and common node. The generating means is configured to electrically bias each of the plurality of branch structures. The absence of one or more of the above-mentioned features inhibits or impedes current flow through the branch. The branch currents that do flow are summed at the common node to provide said process bias signal. In alternative embodiments, the features include a variety of alternative geometries, such as a right-angled corner, a contact, a via, as well as other well known features.

In a third aspect according to the present invention, a method for testing an integrated circuit is provided. The integrated circuit includes a layout structure having a plurality of branch structures. The method includes three basic steps. First, generating a control current using an input reference signal. The second step involves establishing a respective branch current through certain ones of the branch structures when a process bias supports fabrication of the respective features (each having their own minimum dimension associated therewith) Finally, the third step involves generating, using the branch currents, an output signal indicative of the process bias obtained during fabrication of the layout structure.

Other objects, features, and advantages of the present invention will become apparent to one of ordinary skill in the art from the following detailed description and accompanying drawings which illustrate features of the invention by way of example, but not by way of limitation.

BRIEF DESCRIPTION OF THE DRAWINGS

FIGS. 3A–3H illustrate alternate features which may be evaluated according to the invention when used in substitution of the feature geometry used in the branch structures illustrated in FIGS. 1 and 2.

DETAILED DESCRIPTION OF THE PREFERRED EMBODIMENTS

Figure 1:
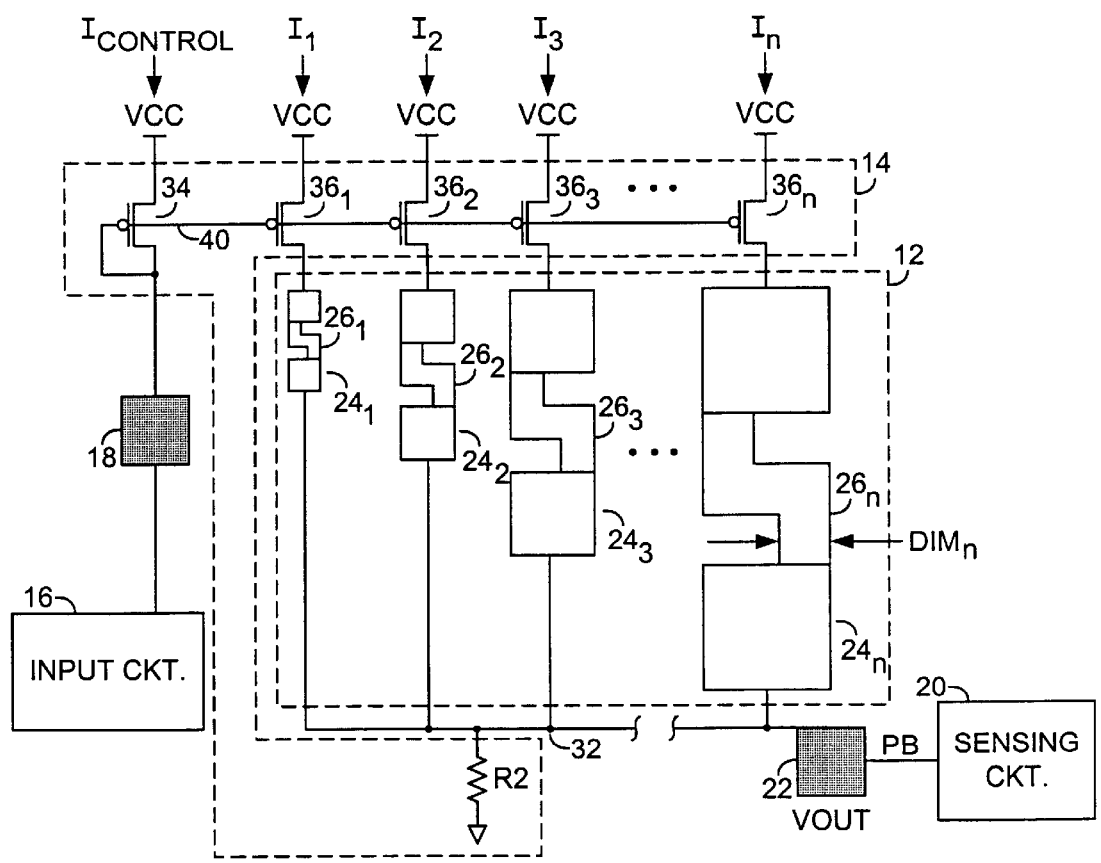
FIG. 1 is a simplified block and schematic diagram view of a first embodiment of the present invention.

Referring now to the drawings wherein like reference numerals are used to identify identical components in the various views, FIG. 1 is a block and schematic diagram view of a first embodiment of a test device according to the present invention. Device 10 may include a layout structure 12, means or circuit 14 for generating a process bias signal PB, an input circuit 16 connected to input pad 18 for controlling operation of circuit 14, and a sensing circuit 20 coupled output pad 22 for sensing the magnitude of the PB signal.

As indicated above, the process bias signal PB provides an indication of the deviation of the achieved minimum feature dimension on the semiconductor wafer (i.e., the minimum feature dimension that was successfully formed on the semiconductor wafer) from a nominal or ideal resolution. Although the PB signal provides a direct indication of the above-mentioned deviation, it also provides information about the process resolution in absolute terms as discussed in the Background.

Before proceeding to a detailed description of the present invention, a brief description of how the invention may be used will be set forth. First, the invention may be used as an end-of-line test to obtain data on how the fabrication process may be varying from wafer to wafer (or within a particular wafer, for example, x axis bias vs. y axis bias). This data may be used in statistical process control, as is known to those of ordinary skill in that art. In addition, such end-of-line test may be used to determine whether or not to "scrap" the part. That is, if the process bias, and thus the achieved process resolution is insufficient to permit the part to operate in a desired fashion (or at all), then the part may be discarded. In a related way, this type of use may be performed at one or more points in the overall process to determine, at the earliest possible stage, whether a semiconductor wafer will yield a useable part at the end. The advantage, of course, is that wafers so identified as being unsuitable at an early stage may be scrapped, thereby saving the remaining effort (time and materials) needed to make the part. Alternatively, later steps may be adjusted to compensate so as to make a suitable part. Third, the present invention may be employed as a control apparatus on an integrated circuit wherein the process bias signal may used as a control signal for varying or adjusting the operation of another part of the integrated circuit. For example, the resulting process bias signal may be used to compensate for circuit speed where circuit speed is critical and is dependent on a particular feature that may be affected by process bias (e.g., metal line capacitive loading).

Referring to FIG. 1, the test device 10 according to the invention may be divided into two functional blocks: a layout structure to test for process bias, and circuitry coupled thereto which allows a precise electrical level reading correlating process bias to a voltage (or to a current) level. The circuitry, in a preferred embodiment, is independent of process variation.

Figure 2:
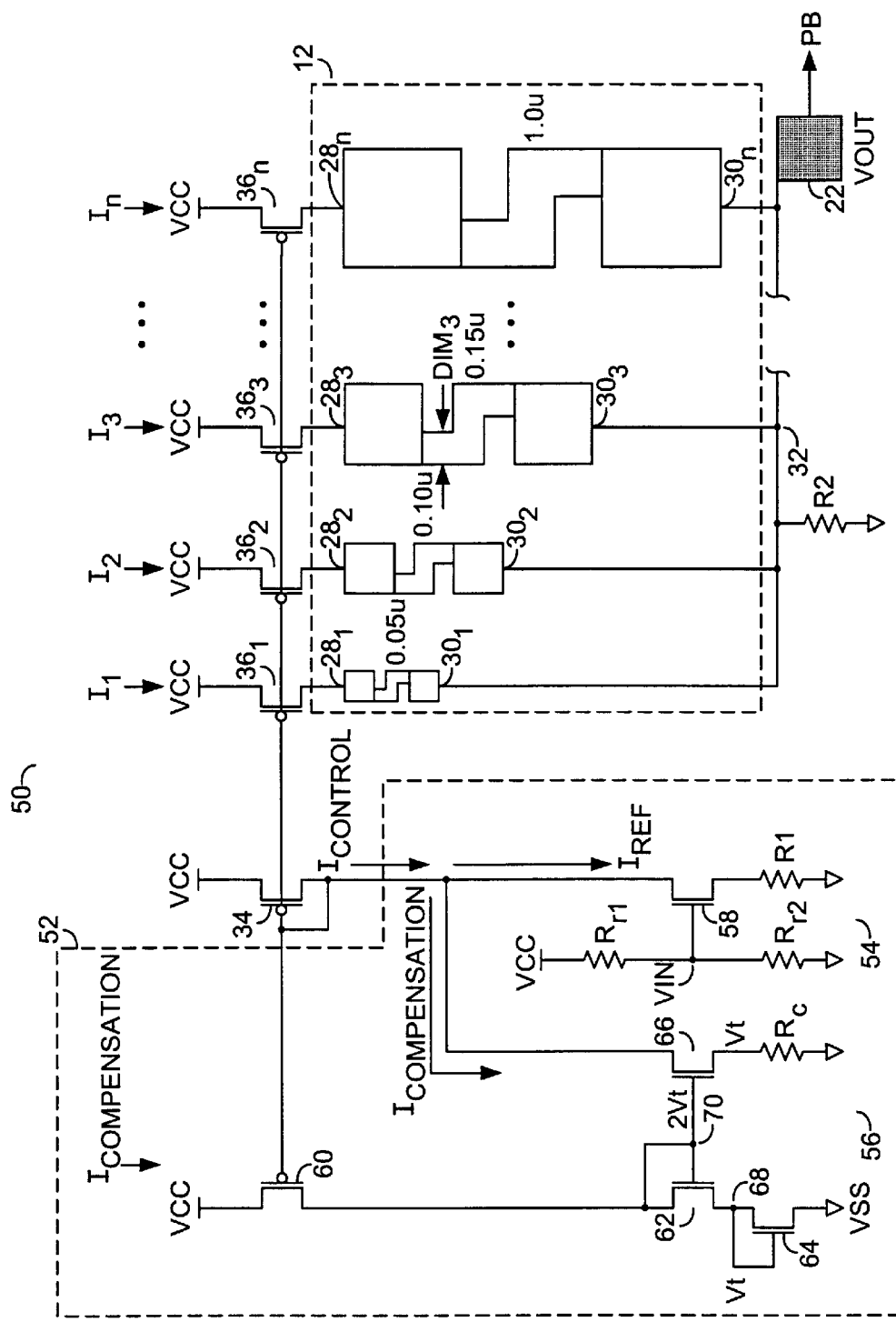
FIG. 2 is a simplified block and schematic diagram view of a second, more preferred embodiment of the present invention, particularly illustrating an active device threshold compensation circuit.

Layout structure 12 includes a plurality of branch structures $24_1, 24_2, 24_3, \ldots, 24_n$ each having a respective feature $26_1, 26_2, 26_3, \ldots, 26_n$. Each feature $26_i$, where i is 1 to n is of a respective predetermined minimum dimension $dim_i$. For example, in FIG. 1, feature $26_n$ is a line having two substantially right-angled turns and having a predetermined $dim_n$. In FIG. 2, feature $26_3$ is of dimension $dim_3$. In one embodiment, the respective predetermined minimum dimensions of features $26_1, 26_2, 26_3, \ldots 26_n$ may be substantially 0.05 microns, 0.10 microns, 0.15 microns, . . . , 1.0 microns (i.e., 20 branch structures). Each branch structure $24_i$ includes a respective first end $28_1, 28_2, 28_3, \ldots, 28_n$ (best shown in FIG. 2), and a respective second end $30_1, 30_2, 30_3, \ldots, 30_n$ (best shown in FIG. 2) connected to a common node 32.

Circuit 14 includes means, such as control PMOS transistor 34, for generating a control current $I_{control}$, means, such as a plurality of current mirror PMOS transistors $36_1, 36_2, 36_3, \ldots, 36_n$, for generating a plurality of branch currents $I_1, I_2, I_3 \ldots, I_n$, and means, such as resistive element R2, for converting the sum of the branch currents $I_1, I_2, I_3 \ldots, I_n$ into a voltage signal indicative of the process bias/resolution.

Control transistor 34 is characterized by a predetermined channel geometry W/L, hereinafter designated $m_{control}$. It should be appreciated that this ratio determines to a substantial extent the current capability of the transistor. Each one of current mirror transistors $36_1, 36_2, 36_3, \ldots, 36_n$, is also characterized by a respective channel width/length (W/L) ratio $m_i, m_2, m_3, \ldots, m_n$. In one embodiment, $m_1$, $m_2, m_3, \ldots, m_n$, are substantially equal to $m_{control}$. In the configuration illustrated in FIG. 1, the gate terminal of each of the current mirror transistors $36_i$, where i equals 1 to n, are tied to the gate or control terminal of control transistor 34. The current control signal 40 applied to the gate terminals of transistor 34 and $36_1, 36_2, \ldots, 36_n$, establish a current mirroring arrangement. Since, as noted above, in one embodiment $m_1, m_2, m_3, \ldots, m_n$, are equal to $m_{control}$, the induced current through the branch structures $I_1, I_2, I_3, \ldots, I_n$, will be substantially equal to $I_{control}$ (provided that the corresponding branch feature $26_i$ is formed).

Input circuit 16, by way of input pad 18, provides the means for establishing the desired level of the control current $I_{control}$. In one embodiment, input circuit 16 is an external circuit; however, in an alternate embodiment to be described hereinafter (FIG. 2), input circuit 16 may be internal to the integrated circuit in which testing device 10 is embodied, thus eliminating the need for the use of input pad 18. The amount of current drawn to establish $I_{control}$ may be used to calibrate the output voltage level of the process bias PB signal.

Sensing circuit 20 may be included to sense the voltage developed on output pad 22 to provide an indication of the process bias or resolution (e.g., to a fab operator).

An underlying concept embodied in the present invention is that only features $26_i$ that have actually been formed during fabrication will pass a respective branch current $I_1$, $I_2, I_3, \ldots, I_n$. Note that since a current mirror arrangement is used, the variation in the resistive component of the respective feature will not substantially impede passage of the full magnitude of the mirrored current. However, where the process bias/resolution obtained cannot support fabrication or formation of one or more of the features $26_i$ (due to narrow sizing) the path for the corresponding branch current is opened. This substantially inhibits current flow. In the case where a feature $26_i$ of one of the branch structures $24_i$ is only marginally formed, the relatively high resistance of the feature causes the corresponding current mirror transistor $36_i$ to collapse and fall into the linear region of operation. The current mirror transistor, in the linear region, will likely be unable to supply the expected mirror current. Since this current will be well below the expected mirrored current, it will not substantially affect the final outcome (i.e., the PB signal voltage level in the preferred embodiment).

With continued reference to FIG. 1, assume that device 10 has been formed as part of an integrated circuit (e.g., on a semiconductor wafer). Depending on the achieved process bias/resolution, one or more of the features 26; may be absent. When a control current $I_{control}$ is generated using an input reference signal, such as that may be provided by way of input circuit 16, a respective branch current is established through each branch structure having a formed feature $26_i$. The plurality of branch currents that actually flow are summed at common node 32 and flow, collectively, through resistor R2. This produces an output signal, namely, the process bias signal PB, as a function of the total current level through R2. The output provides certainty in assessing the extent of the process bias and/or process resolution. For example, a PB signal of 1 to 1.2 volts may mean the process bias equals 0.1 microns. A PB signal of 1.3 to 1.5 volts may mean a 0.15 micron process bias, etc. The precision provided by the present invention is a substantial improvement relative to conventional approaches.

In addition, layout structure 12 provides for a visual test. Each structure has a predetermined dimension $dim_1$, $dim_2, \ldots, dim_n$, associated therewith. Since the fab knows the predetermined dimensions ahead of time, a visual inspection will quickly permit the operator to determine the precise process bias by simply identifying which branch has a formed feature (and which do not). In one embodiment, the predetermined dimension associated with adjacent branch structures increases a fixed amount from left-to-right, or vice-versa. The fab operator need only count the number of structures from the end branch structure to ascertain the precise process bias.

Referring now to FIG. 2, a second embodiment of the present invention is illustrated, namely device 50. Device 50 is substantially similar to device 10, except that input circuit 16 and pad 18 have been replaced by an internal means 52 for compensating for an active device threshold parameter. Means 52 includes means or circuit 54 for generating an input reference current $I_{ref}$, and means or circuit 56 for generating a compensation current $I_{compensation}$.

Means 54 may include resistive elements Rr1, Rr2, R1, and input transistor 58. Compensation current generating means 56 may include a compensation transistor, such as P-channel transistor 60, N-channel transistors 62, 64, and 66, and resistive element Rc.

The circuitry of device 50 is substantially independent of process variation. An input voltage, which is produced by a resistive voltage divider defined by Rr1, and Rr2, is applied to the input terminal (i.e., gate terminal) of transistor 58. The current generated by transistor 58 is dependent on the resistance below its source terminal, namely R1, and the active device threshold Vt drop between the gate terminal and the source terminal of transistor 58 (this assumes a large W/L ratio associated with transistor 58). To compensate for the device threshold Vt dependency, circuit 56 is provided which generates a compensation current as a function of Vt, which in effect cancels the Vt dependency. The following equations illustrate how the Vt dependency is cancelled.

$$Vin=(Vcc*Rr1)/(Rr1+Rr2). \tag{1}$$

Since Vgs of the transistor is substantially equal to Vt for a relatively large W/L ratio (e.g., 100:1 or 200:1), then:

$$V1=Vin-Vgs=Vin-Vt \tag{2}$$

$$I_{ref}=V1/R1=(Vin-Vt)/R1=Vin/R1-Vt/R1 \tag{3}$$

To remove the Vt dependency we need a current source to add a term to equation (3), namely, Vt/R1:

$$I_{control}=I_{ref}+I_{comp}=(Vin/R1-Vt/R1)+Vt/Rc \tag{4}$$

If Rc=R1, then $I_{control}$=Vin/R1

The resistor dependency may also be canceled out by matching resistors R1 and R2, as shown by equations 5 and 6 below:

$$Vout=I_{control}*(m1/m_{control})*R2+I_{control}*(m2/m_{control})*R2+I_{control}*(m3/m_{control})*R2+\ldots+I_{control}(mn/m_{control})*R2 \tag{5}$$

$$Vout=(Vin)*[(m1/m_{control})*R2/R1+(m2/m_{control})*(R2/R1)+(m3/m_{control})*(R2/R1)+\ldots+(mn/m_{control})*(R2/R1)] \tag{6}$$

The operation of device 50 is essentially the same as described above in connection with device 10, except that the output signal PB is not dependent on either transistor threshold Vt, nor resistor process deviation. Device 50 further requires only one pad due to the internal reference source, which generates $V_n$.

In another aspect of the present invention, the ratios m1, m2, m3, ..., $m_n$, may be modified, relative to $m_{control}$, to thereby increase or decrease the respective branch current that each branch is to carry. This may be used to weight the feature $26_i$ associated with that branch in a predetermined desired manner. For example, the weighting of any particular branch structure may not be equal to the weighting associated with the features of the other branch structures. For purposes of illustration only, assume that there are only two branch structures and each is adapted to carry a branch current of 10 microamps when the feature is formed. Thus, when both features $26_i$ are present, a total of 20 microamps flow into common node 32. When one of the features is not formed, the total current into common node 32 is only 10 microamps. This represents a 2:1 ratio between the two above-described conditions. Now, assume that the branch structure with the smaller dimension feature is adapted to carry 30 microamps when that feature is present. This may be done by adjusting the W/L ratio of the corresponding current mirror transistor. Now, when both features are present, 40 microamps (i.e., 30+10) flow into common node 32, whereas when the feature having the smaller dimension is not formed, only 10 microamps flow into common node 32. This represents a 4:1 range between the two above-mentioned states. This weighting feature may be used to vary the sensitivity of the output voltage signal PB relative to the formation of certain feature geometries (or feature sizes).

FIGS. 3A–3H illustrate alternate branch structures which may be used in layout structure 12. In accordance with the invention, any connecting (i.e., conductive) layer and geometry can be used for defining the feature of one or more of the branch structures.

FIG. 3A shows a simple line connecting "island." This is the feature geometry which is illustrated in FIGS. 1 and 2. In particular, the feature is such that process bias in the x axis and process bias in the y axis can be determined using the feature (the process bias/resolution may not be the same in both axes).

FIG. 3B illustrates branch structure $124_i$ which comprises an "island" without any corners.

FIG. 3C shows a branch structure $224_i$ that includes parallel conducting lines which, collectively, provide a relatively low resistance path for electrical current. This is a particularly useful feature to use when testing polycrystalline silicon, which may have a higher resistance (depending on doping levels and relative to, for example, metal) than may be desirable for use in layout structure 12. The structure thus provides the means to test the process bias/resolution of relatively low conductivity layers, while maintaining adequate current levels for electrical sensing, as described above.

FIG. 3D illustrates branch structure $324_i$ which includes an opening feature (proximity effect) which tests how narrow an opening may be made. Thus, if the feature is successfully formed, no current flows. The level of current, collectively, through a layout structure using this feature is inversely proportional to the process bias/resolution. As with the embodiment in FIG. 3A, this feature is also effective to test the process bias in the x and y axes.

FIG. 3E illustrates branch structure $424_i$ which includes a feature adapted to test holes (vias).

FIG. 3F illustrates branch structure $524_i$ which shows a feature adapted to test an opening, such as that shown in FIG. 3D, but without any right-angled corners (proximity effect).

FIG. 3G illustrates branch structure $624_i$ which includes a feature comprising an island and space and a plurality of substantially right-angled corners.

FIG. 3H illustrates branch structure $724_i$ which has a feature adapted to integrated structure (i.e., one spanning a plurality of layers in the semiconductor wafer). In particular, the illustrated feature includes a polycrystalline silicon ("poly") layer, a poly-to-metal 1 contact, a metal 1 layer, a metal 1-to-metal2 via, and a metal2 layer. The structure also includes island spacing and corners.

Thus, the layout structure 12 illustrated in FIGS. 1 and 2 can easily be modified from the "island" structure there-shown to a structure capable of measuring hole bias (via, contact), fuse layout limitation, spacing resolution, and even a combination of those features to form an integrated structure (e.g., FIG. 3H). Of course, one or more of the above-described branch structures may be used in the same layout structure 12.

The proposed layout structure 12 offers flexibility in the type of layers that can be used (all conducting layers), and the type of feature sought to be examined (hole, island, corners, etc.). Of course, any of the features incorporated in the branch structures of FIGS. 3A–3H may be arranged in a progressively increasing/decreasing manner (with respect to minimum dimension size included in the feature).

Figure 4:
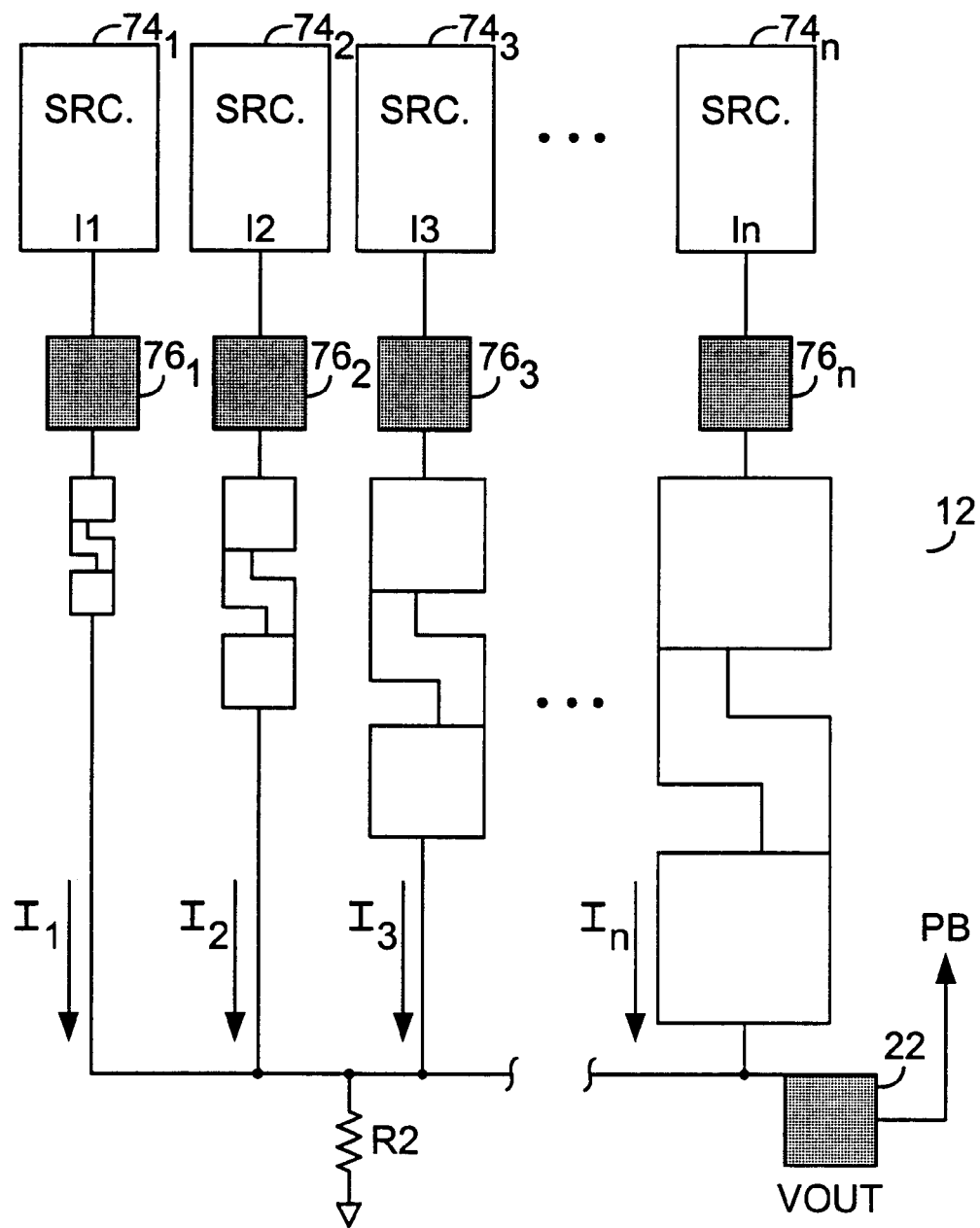
FIG. 4 shows yet another embodiment of the present invention wherein independent current sources are used to provide the respective branch currents through the layout structure.

Referring now to FIG. 4, an alternate embodiment, namely device 72, according to the invention is illustrated. Device 72 includes a plurality of externally applied independent current sources $74_1$, $74_2$, $74_3$, ..., $74_n$ applied to a corresponding plurality of input pads $76_1$, $76_2$, $76_3$, ..., $76_n$. Device 72 features an independent pad for each branch structure. Each branch structure may be tested individually. An output signal indicates that the structure as a whole is conducting, while a dead signal points out to an unresolved structure (i.e., one that is not formed). The reverse holds when the feature under test is spacing/opening (testing for an electrical "open" circuit).

Figure 5:
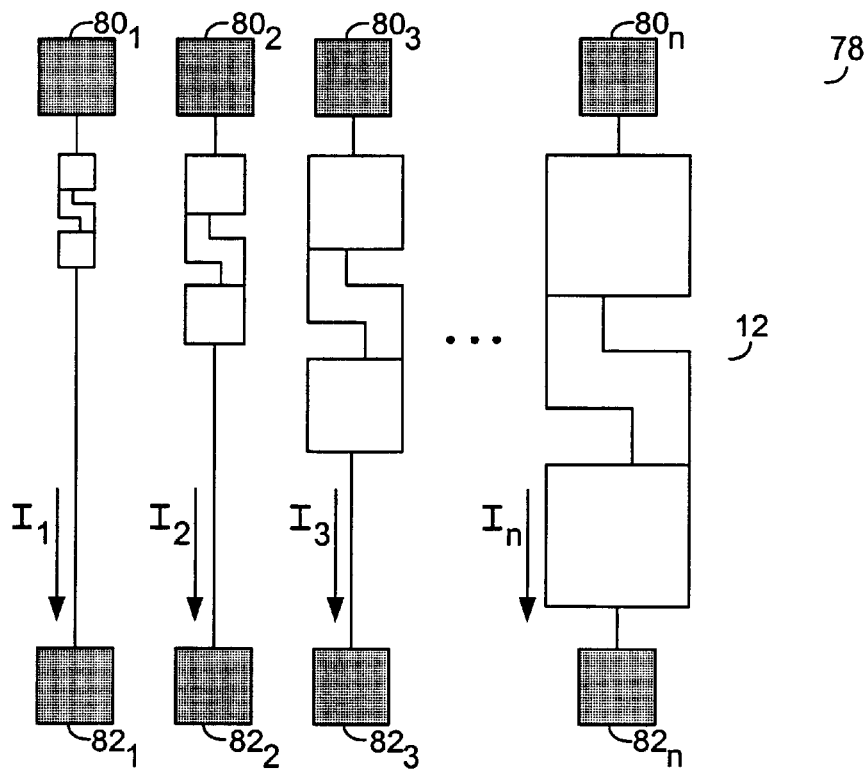
FIG. 5 illustrates yet another embodiment utilizing individual pads and wherein each branch structure is in parallel orientation with respect to another.

FIG. 5 shows still another alternate embodiment, namely device 78, which features an independent pad/parallel branch structure implementation. Device 78 includes a first plurality of pads $80_1$, $80_2$, $80_3$, ..., $80_n$ associated with the plurality of branch structures defining layout structure 12. In addition, device 78 includes a second plurality of pads $82_1$, $82_2$, $82_3$, ..., $82_n$, one pad for each branch structure. Device 78 provides the means to perform an independent resistive check for each branch structure. Note, the branch currents $I_1$, $I_2$, $I$, ..., $I_n$ are arbitrarily shown going from pads $80_i$ to $82_i$. This may be reversed by appropriate polarity selection of the current sources used.

Figure 6:
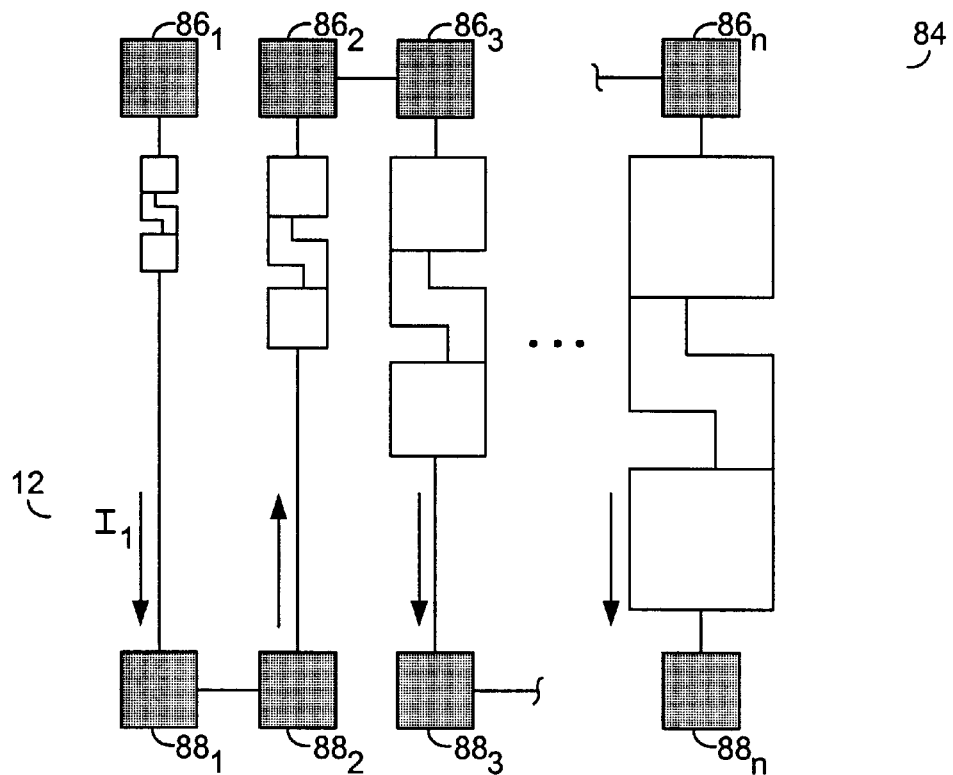
FIG. 6 shows still yet another embodiment of the present invention employing individual pads and wherein the branch structures are in series-relationship to each other.

Referring to FIG. 6, still yet another alternate embodiment, namely device 84, is illustrated. Device 84 includes pads $86_1$, $86_2$, $86_3$, ..., $86_n$ and pads $88_1$, $88_2$, $88_3$, ... $88_n$. The structure of device 84 is similar to that of device 78 shown in FIG. 5, except with a series orientation.

Figure 7:
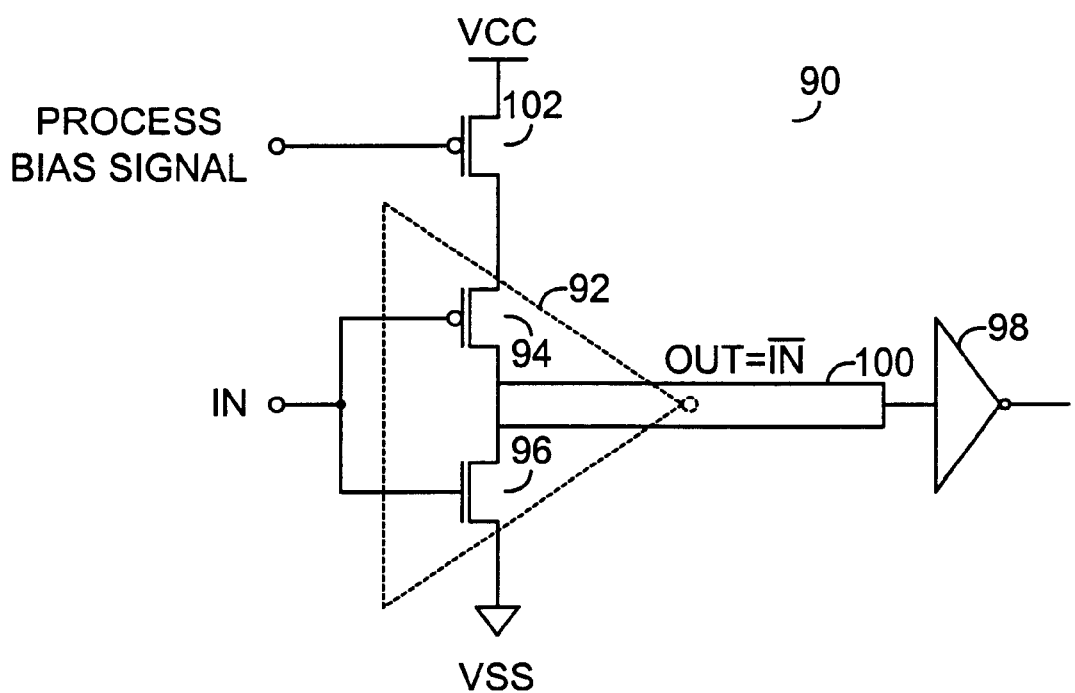
FIG. 7 shows how the process bias signal can be used to adjust the operation of an exemplary circuit to compensate for process bias.

FIG. 7 shows a particular application of how the PB signal generated from any of the above-described embodiments may be used. Process bias compensation arrangement 90 includes a first inverter 92 comprising PMOS transistor 94 and NMOS 96, a second inverter 98, a critical feature 100, and a control gate, such as PMOS transistor 102. Assume that feature 100 is a feature that is critical to the operation of an integrated circuit. For example, this may be a metal line, where speed of operation is important. Of course, process bias/resolution may cause the width of the metal line to be either greater, or less than the designed value. Accordingly, transmission parameters may change, such as load capacitance, which may affect speed (such as the switching speed of inverter 92). A feature similar to feature 100 would then be implemented in layout structure 12. Each of the branch structures $24_i$ would include a feature 100 of a progressively an increasing/decreasing minimum dimension (size). The process bias signal PB generated at the output of, for example, device 50, would then be fed to transistor 102. It is well known that the switching speed of inverter 92 may be changed by increasing or decreasing the current provided thereto by way of control transistor 102. Accordingly, to the extent that process bias may change the transmission characteristics of feature 100, and thus the switching characteristic of inverter 92, the process bias signal PB may be used to compensate for the changed switching characteristic due to process bias. This approach may be used to gain a desired level of performance. Implementation requires no more than routine application of design principles well known to those skilled in the art.

While the present invention was illustrated and described with respect to a preferred embodiment, such description is exemplary only and not limiting in nature. Other aspects, objects, and advantages of this invention may be obtained from the study of the drawings, and the disclosure.

What is claimed is:

1. A method of testing an integrated circuit having a layout structure which includes a plurality of branch structures, comprising the steps of:
   (A) generating a control current in response to an input reference;
   (B) establishing a respective branch current through each of said plurality of branch structures when a process bias supports fabrication of a respective predetermined dimension associated with the branch structures; and
   (C) generating, in response to said branch currents, an output indicative of said process bias obtained during fabrication of said layout structure.

2. The method of claim 1, wherein step (A) includes the sub-step of:
   (A-1) generating an input reference current in response to said input reference.

3. The method of claim 2, wherein step (A) includes the sub-step of:
   (A-2) generating a compensation current as a function of an active device threshold parameter.

4. The method of claim 3, wherein step (A) includes the sub-step of:
   (A-3) outputting said control current as a function of said input reference current and said compensation current.

5. The method of claim 1, wherein step (B) includes the sub-step of:
   (B-1) forming a respective feature in each of said plurality of branch structures in accordance with said process bias, said respective features comprising electrically conductive material to thereby selectively establish said branch currents based on said process bias obtained during fabrication of said layout structure.

6. The method of claim 1, wherein step (C) includes the sub-step of:
   (C-1) summing said plurality of branch currents to define a total current.

7. The method of claim 6, wherein step (C) includes the sub-step of:
   (C-2) producing said output as a function of said total current.

8. The method of claim 1, wherein said plurality of branch structures each comprises a respective feature that is present when said process bias supports fabrication of each one of a plurality of increasing predetermined dimensions respectively associated with each of said respective features of said plurality of branch structures.

9. The method of claim 8, wherein said respective features are the same geometric shape.

10. The method of claim 8, wherein said respective features each include at least one substantially right-angled bend.

11. The method of claim 1, wherein said plurality of branch structures comprise a material selected from a group consisting of metal or polysilicon.

12. The method of claim 1, wherein:
   a first one of said plurality of branch structures comprising a first feature that is present when said process bias supports fabrication of a first predetermined dimension associated with said first feature, said first feature being absent otherwise; and
   a second one of said plurality of branch structures adjacent to said first branch structure comprising a second feature that is present when said process bias supports fabrication of a second predetermined dimension associated with said second feature, wherein said second predetermined dimension is larger than said first predetermined dimension, said second feature being otherwise absent.

13. The method of claim 12, wherein step (B) includes electrically biasing each one of said plurality of branch structures, wherein the absence of at least one of said first and second features varies electrical current through said layout structure to thereby provide an indication of a magnitude of said process bias.

14. The method of claim 12, wherein at least one of said first and second features comprises an island.

15. The method of claim 12, wherein at least one of said first and second features comprises an opening.

16. The method of claim 12, wherein at least one of said first and second features comprises a via for connecting layers of said integrated circuit.

17. The method of claim 1, wherein one or more of said plurality of branch structures comprise a substantially right-angled corner.

18. A method of testing an integrated circuit having a layout structure comprising the steps of:
   (A) generating a control current; and
   (B) establishing a respective branch current through each of a plurality of branch structures when a process bias supports fabrication of a respective predetermined dimension associated with the plurality of branch structures and generating an output indicative of said process bias obtained during fabrication of said layout structure.

19. The method of claim 18, wherein step (A) comprises the sub-steps of;
   (A-1) generating an input reference current;
   (A-2) generating a compensation current; and
   (A-3) outputting said control current as a function of said input reference current and said compensation current.

* * * * *